United States Patent
Mazzillo et al.

(10) Patent No.: US 10,797,196 B2
(45) Date of Patent: Oct. 6, 2020

(54) PHOTODETECTOR INCLUDING A GEIGER MODE AVALANCHE PHOTODIODE AND AN INTEGRATED RESISTOR AND RELATED MANUFACTURING METHOD

(71) Applicant: STMICROELECTRONICS S.R.L., Agrate Brianza (IT)

(72) Inventors: Massimo Cataldo Mazzillo, Corato (IT); Valeria Cinnera Martino, Valverde (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/386,163

(22) Filed: Apr. 16, 2019

(65) Prior Publication Data

US 2019/0319158 A1      Oct. 17, 2019

(30) Foreign Application Priority Data

Apr. 17, 2018   (IT) .................. 102018000004622

(51) Int. Cl.
*H01L 31/14*      (2006.01)
*H01L 27/14*      (2006.01)
(Continued)

(52) U.S. Cl.
CPC .............. *H01L 31/145* (2013.01); *G01J 1/44* (2013.01); *H01L 27/1446* (2013.01);
(Continued)

(58) Field of Classification Search
CPC ................... G01J 1/44; G01J 2001/442; G01J 2001/4466; H01L 27/1446;
(Continued)

(56) References Cited

U.S. PATENT DOCUMENTS 5,434,442 A   7/1995   Lesk et al.
5,759,367 A   6/1998   Matsuura et al.
(Continued)

FOREIGN PATENT DOCUMENTS

| JP | 8-82612 A | 3/1996 |
|---|---|---|
| JP | 2014-132241 A | 7/2014 |
| KR | 10-1763865 B1 | 8/2017 |

OTHER PUBLICATIONS

Alphasense Application Note, "p-type Metal Oxide Sensor Overview and Interface Circuit," AAN 601-03, Alphasense Ltd., Jan. 2019, 4 pages.

(Continued)

*Primary Examiner* — Chih-Cheng Kao
(74) *Attorney, Agent, or Firm* — Seed IP Law Group LLP

(57) ABSTRACT

A photodetector includes a Geiger mode avalanche photodiode, which includes a body of semiconductor material, which is delimited by a front surface. The avalanche photodiode further includes: a cathode region having a first type of conductivity, which forms the front surface; and an anode region having a second type of conductivity, which extends in the cathode region starting from the front surface. The photodetector further includes: a dielectric region, arranged on the front surface; a quenching resistor, which extends on the dielectric region, is electrically connected to the anode region, and is laterally spaced apart with respect to the anode region; and an optical-isolation region, which extends through the dielectric region and laterally delimits a portion of the dielectric region, the anode region extending underneath the portion of the dielectric region, the optical-isolation region being moreover interposed between the portion of the dielectric region and the quenching resistor.

20 Claims, 12 Drawing Sheets

(51) Int. Cl.
*H01L 31/024* (2014.01)
*H01L 31/0216* (2014.01)
*H01L 31/107* (2006.01)
*H01L 31/18* (2006.01)
*G01J 1/44* (2006.01)
*H01L 31/0352* (2006.01)
*H01L 27/144* (2006.01)

(52) U.S. Cl.
CPC ...... *H01L 31/024* (2013.01); *H01L 31/02164* (2013.01); *H01L 31/035281* (2013.01); *H01L 31/107* (2013.01); *H01L 31/1864* (2013.01); *G01J 2001/442* (2013.01); *G01J 2001/4466* (2013.01)

(58) Field of Classification Search
CPC ............. H01L 31/02164; H01L 31/024; H01L 31/035281; H01L 31/107; H01L 31/145; H01L 31/1864; H01L 31/1075
See application file for complete search history.

(56) References Cited

U.S. PATENT DOCUMENTS

| | | | |
|---|---|---|---|
| 9,799,757 | B2 | 10/2017 | Gridelet et al. |
| 2006/0118903 | A1 | 6/2006 | Cahen et al. |
| 2008/0156993 | A1* | 7/2008 | Weinberg ............... A61B 6/037 250/363.03 |
| 2010/0102242 | A1 | 4/2010 | Burr et al. |
| 2011/0241149 | A1* | 10/2011 | Mazzillo ............... H01L 31/107 257/438 |
| 2012/0153423 | A1* | 6/2012 | Lee ...................... H01L 31/103 257/446 |
| 2014/0234981 | A1 | 8/2014 | Zarkesh-Ha et al. |
| 2016/0216227 | A1 | 7/2016 | Boni |
| 2016/0282259 | A1 | 9/2016 | Kolb et al. |
| 2018/0033895 | A1 | 2/2018 | Mazzillo et al. |

OTHER PUBLICATIONS

Das et al., "Design and fabrication of low power polysilicon sources," Solid-State Electronics 43:12399-1244, 1999.
Figaro, "Non-Dispersive Infra-Red (NDIR) CO2 Sensor," published online 2018, downloaded on May 23, 2019 from https://www.figaro.co.jp/en/product/feature/cdm7160.html, 6 pages.
Fox et al., "MEMS and Sensors: Environment and Health Sensors in Mobile Devices," IHS Technology Report, 2017, 95 pages.
Hamamatsu Photonics K. K., "Mini-spectrometer [Micro series] C12666MA" product specifications datasheet, Catalog No. KACC1216E10, Jan. 2019, 11 pages.
Korotcenkov, "Metal oxides for solid-state gas sensors: What determines our choice?," Materials Science and Engineering B 139:1-23, 2007.
Laconte et al. (ed), Micromachined Thin-Film Sensors For SOI-CMOS Co-Integration, Springer, Dordrecht, The Netherlands, 2006, 291 pages.
Laskovski (ed), Biomedical Engineering, Trends in Electronics, InTech, London, UK, 2011, Chapter 16, Gao et al., "Integrated High-Resolution Multi-Channel Time-to-Digital Converters (TDCs) for PET Imaging," pp. 295-316 (24 pages).
McConnell et al., "Thermal Conductivity of Doped Polysilicon Layers," Journal of Microelectromechanical Systems 10(3):360-369, 2001.
Sensirion, "Datasheet SGPC3 Sensirion Gas Platform," product specifications datasheet, Version 0.91, Feb. 2018, 16 pages.
Soundarrajan, "Achieving the Potential of Nano Gas Sensors," published online Sep. 1, 2006, downloaded from https://www.sensorsmag.com/components/achieving-potential-nano-gas-sensors, 4 pages.
Tisa et al., "Electronics for single photon avalanche diode arrays," Sensors and Actuators A 140:113-122, 2007.
Zappa et al., "Principles and features of single-photon avalanche diode arrays," Sensors and Actuators A 140:103-112, 2007.

\* cited by examiner

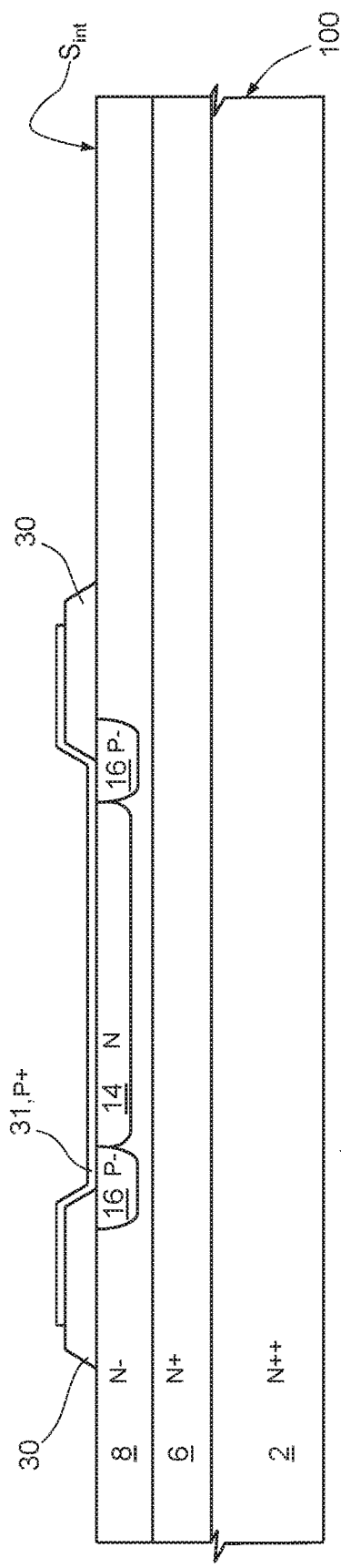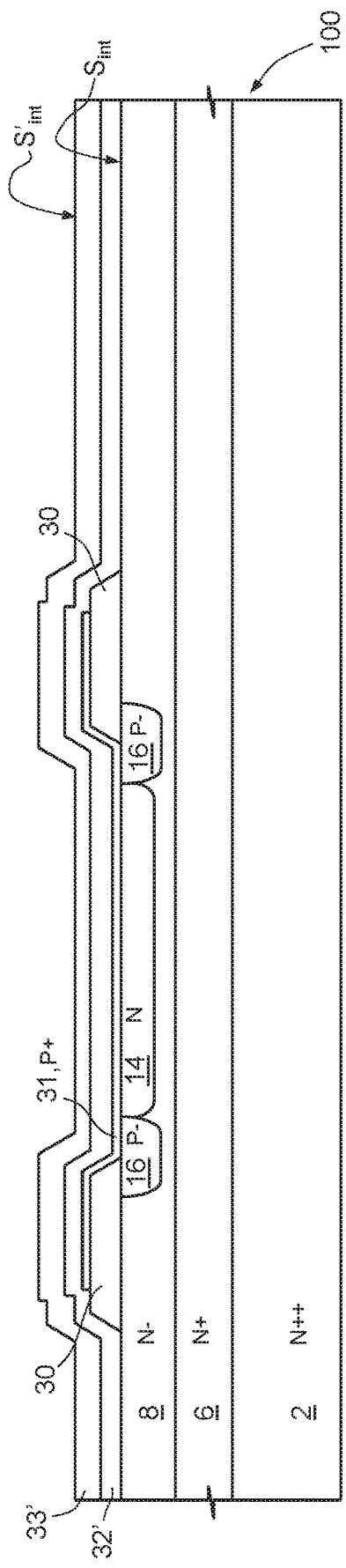

PHOTODETECTOR INCLUDING A GEIGER MODE AVALANCHE PHOTODIODE AND AN INTEGRATED RESISTOR AND RELATED MANUFACTURING METHOD

BACKGROUND

Technical Field

The present disclosure relates to a photodetector including a Geiger mode avalanche photodiode (GMAP) and an integrated resistor as well as to the related manufacturing method.

Description of the Related Art

As is known, today available are avalanche photodiodes operating in Geiger mode, also known as single-photon avalanche diodes (SPADs), in so far as they enable, at least in theory, detection of single photons.

In detail, it is known that a SPAD comprises a junction of semiconductor material, which presents a breakdown voltage $V_B$ and is biased, in use, at a reverse-biasing voltage $V_A$ higher in modulus than the breakdown voltage $V_B$. In this way, the junction presents a particularly extensive depleted region, present in which is a non-negligible electrical field. Hence, generation of a single electron-hole pair, caused by absorption within the depleted region of a photon incident on the SPAD, may be sufficient for triggering an ionization process. This ionization process in turn causes an avalanche multiplication of the carriers, with gains of around $10^6$, and consequent generation in short times (hundreds of picoseconds) of the so-called avalanche current, or more precisely of a pulse of the avalanche current.

The avalanche current can be collected by means of an external circuit connected to the junction and represents a signal generated by the SPAD, also referred to as "output current". In practice, for each photon absorbed, a pulse of the output current of the SPAD is generated.

The fact that the reverse-biasing voltage $V_A$ is higher, in modulus, than the breakdown voltage $V_B$ causes the avalanche-ionization process, once triggered, to be self-sustaining. Consequently, once the avalanche-ionization process has been triggered, the SPAD is no longer able to detect photons, with the consequence that, in the absence of appropriate remedies, the SPAD manages to detect arrival of a first photon, but not arrival of subsequent photons. To be able to detect also the subsequent photons, one can quench the avalanche current generated within the SPAD, thus arresting the avalanche-ionization process, and in particular lowering, for a period of time known as "hold-off time", the effective voltage $V_e$ across the junction, so as to inhibit the ionization process. For this purpose, there is known the use of so-called quenching circuits, which may be of an active or passive type. Then, the reverse-biasing voltage $V_A$ is restored in order to enable detection of a subsequent photon.

This having been said, it is known that, thanks to the high sensitivity, SPADs are encountering extensive use within optoelectronic detection systems, for example in the biomedical field, or else in the field of detection of gaseous chemical species.

For example, optoelectronic detection systems are known, which include, in addition to at least one SPAD, an optical source, which emits optical radiation (for example, in the infrared), which in turn interacts with a sample to be analyzed (for example, a human tissue) and is subsequently received by the SPAD.

This having been said, the SPAD and the optical source are physically separate, with consequent increase in complexity and costs, as well as reduction of the possibility of miniaturization.

BRIEF SUMMARY

One or more embodiments of the present disclosure provide a photodetector that will overcome at least in part the drawbacks of the prior art.

According to the present disclosure, a photodetector and a related manufacturing method are provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 6-16 are schematic cross-sectional views of a photodetector, during successive steps of a manufacturing method.

DETAILED DESCRIPTION

Figure 1:
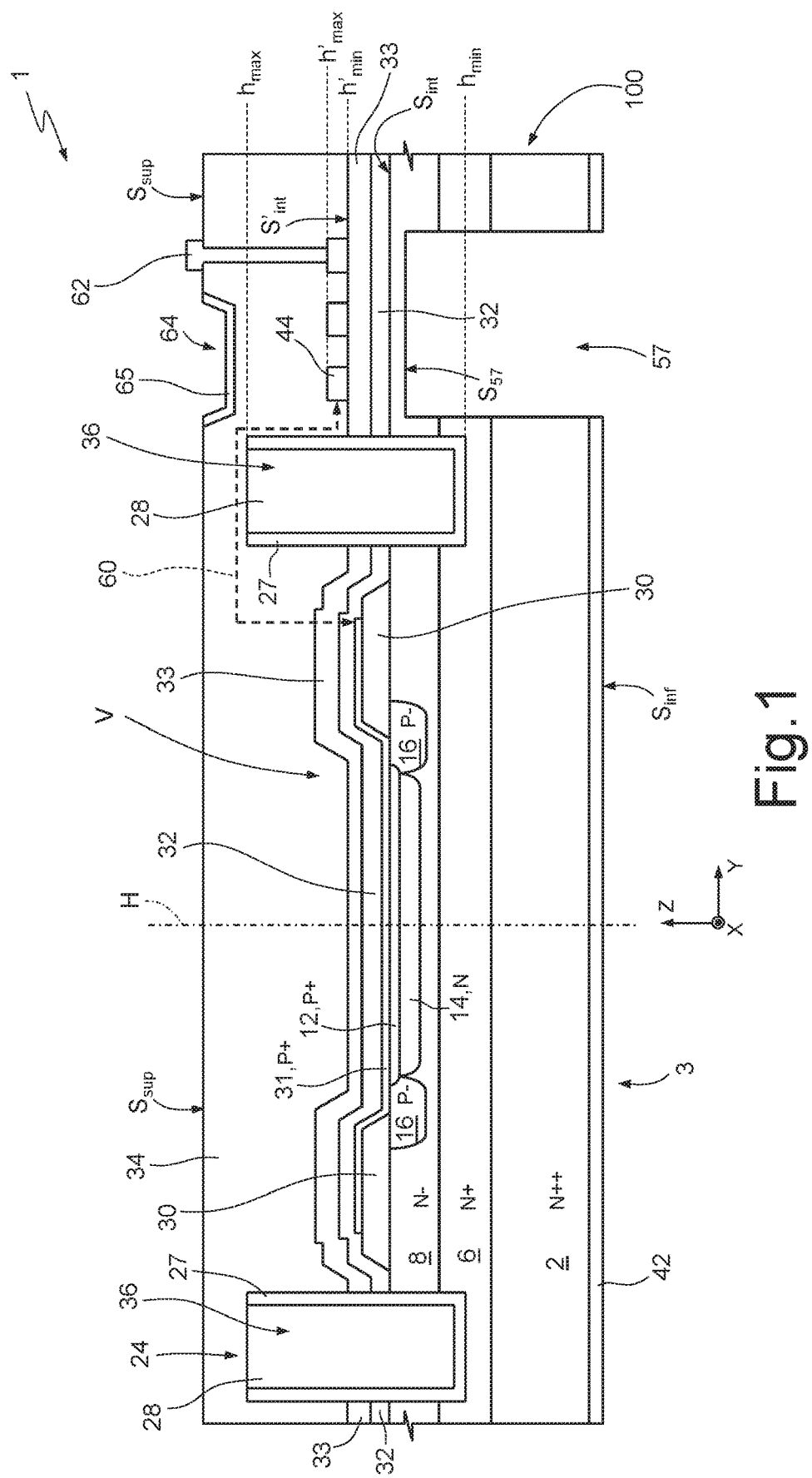
FIG. 1 is a schematic cross-sectional view of an embodiment of the present photodetector.
Figure 2:
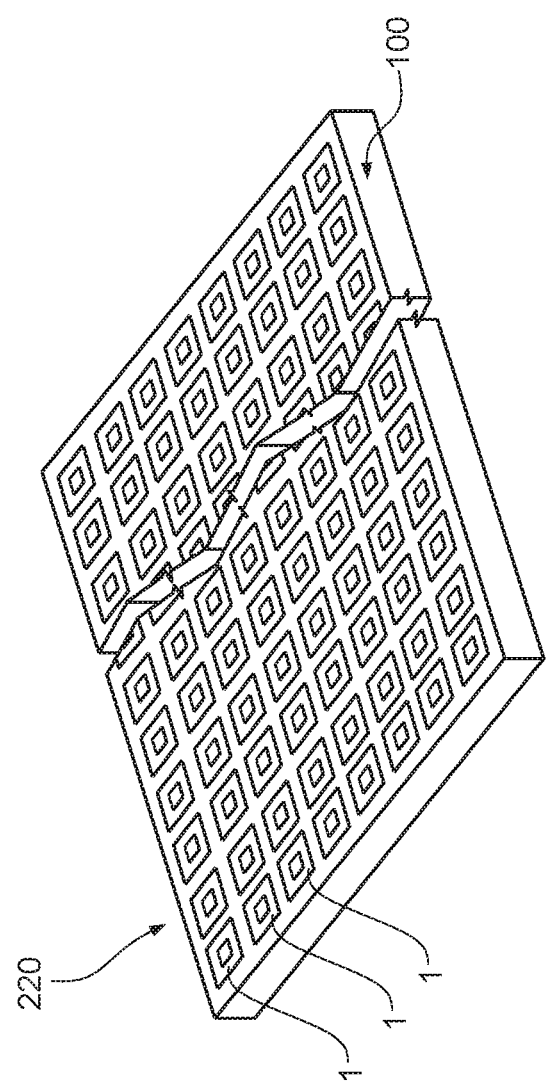
FIG. 2 is a schematic perspective view of an array of detection devices.

In greater detail, FIG. 1 shows a photodetector 1, which is integrated in a die 100 of semiconductor material. As illustrated in FIG. 2, the photodetector 1 may form part of an array 220 of photodetectors that are the same as one another, all designated by 1.

In detail, the photodetector 1 comprises a semiconductor body 3, which is made, for example, of silicon and in turn comprises a substrate 2, and a first epitaxial layer 6 and a second epitaxial layer 8. In FIG. 1, and likewise in the subsequent figures, the thicknesses of the substrate 2 and of the first and second epitaxial layers 6, 8 are not in scale, as neither are the thicknesses of the other regions, described hereinafter.

The substrate 2 is of an N++ type, has a thickness of, for example, between 300 μm and 500 μm, and has a doping level of, for example, between $1 \cdot 10^{19}$ cm$^{-3}$ and $1 \cdot 10^{20}$ cm$^{-1}$.

The first epitaxial layer 6 is of an N+ type, has a thickness of, for example, between 4 μm and 8 μm and overlies, in direct contact, the substrate 2. Moreover, the first epitaxial layer 6 has a doping level of, for example, between $1 \cdot 10^{16}$ cm$^{-3}$ and $5 \cdot 10^{16}$ cm$^{-3}$.

The second epitaxial layer 8 is of an N− type, has a thickness of, for example, between 3 μm and 5 μm and overlies the first epitaxial layer 6, with which it is in direct contact. Moreover, the second epitaxial layer 8 has a doping level of, for example, between $1 \cdot 10^{14}$ cm$^{-3}$ and $3 \cdot 10^{14}$ cm$^{-3}$. Moreover, the second epitaxial layer 8 forms a first intermediate surface $S_{int}$, which delimits the semiconductor body 3 at the top.

An anode region 12, of a P+ type, which has, in top plan view, a circular or polygonal (for example, quadrangular)

shape, gives out onto the first intermediate surface $S_{int}$ and extends in the second epitaxial layer 8. In particular, the anode region 12 has a thickness of, for example, between 0.05 µm and 0.4 µm; moreover, the anode region 12 has a doping level of, for example, between $1 \cdot 10^{18}$ cm$^{-3}$ and $1 \cdot 10^{19}$ cm$^{-3}$.

An enriched region 14, of an N type, extends in the second epitaxial layer 8, underneath, and in direct contact with, the anode region 12. In top plan view, the enriched region 14 has a circular or polygonal (for example, quadrangular) shape; moreover, the enriched region 14 has a thickness of, for example, 1 µm and a doping level of, for example, between $1 \cdot 10^{16}$ cm$^{-3}$ and $5 \cdot 10^{16}$ cm$^{-3}$.

For practical purposes, the anode region 12 and the enriched region 14 form a first PN junction, designed to receive photons and generate the avalanche current. The enriched region 14 and the second epitaxial layer 8 have, instead, the purpose of confining a high electrical field in the proximity of the first PN junction, reducing the breakdown voltage $V_B$ of the junction itself.

A guard ring 16 having a circular shape, of a P– type and with a doping level of between $1 \cdot 10^{16}$ cm$^{-3}$ and $3 \cdot 10^{16}$ cm$^{-3}$, extends in the second epitaxial layer 8; in particular, the guard ring 16 gives out onto the first intermediate surface $S_{int}$ and is arranged on the outside of the anode region 12, with which it is in direct contact. Moreover, the guard ring 16 has a thickness of, for example, between 1 µm and 3 µm.

The guard ring 16 forms a second PN junction with the second epitaxial layer 8 so as to prevent edge breakdown of the anode region 12.

The photodetector 1 further comprises a cathode metallization 42, made of metal material, which extends underneath the substrate 2, with which it is in direct contact. Albeit not shown, the cathode metallization 42 may be formed by a corresponding multilayer structure of metal material. Moreover, the cathode metallization 42 is delimited at the bottom by a bottom surface $S_{inf}$.

The photodetector 1 further comprises a first dielectric region 30, which extends on the first intermediate surface Sint, is made, for example, of thermal oxide and has a thickness of, for example, 0.8 µm. In particular, the first dielectric region 30 has a hollow shape, such as the shape of an annulus or of a polygonal frame. The first dielectric region 30 hence defines a recess that leaves the anode region 12 exposed. In other words, whereas the anode region 12 gives out onto a central portion of the first intermediate surface Sint, the first dielectric region 30 extends on a peripheral portion of the first intermediate surface Sint. Moreover, the first dielectric region 30 extends partially over the guard ring 16, with which it is in direct contact.

The photodetector 1 further comprises a region 31, referred to hereinafter as the intermediate region 31.

In detail, the intermediate region 31 is made, for example, of polysilicon, is of a P+ type, has a doping level of, for example, between $1 \cdot 10^{20}$ cm$^{-3}$ and $3 \cdot 10^{20}$ cm$^{-3}$ and has a thickness of, for example, between 50 nm and 100 nm. Moreover, the intermediate region 31 extends, in direct contact, on the first dielectric region 30 and on the anode region 12, as well as on the guard-ring portion 16 left exposed by the first dielectric region 30.

In greater detail, and without this implying any loss of generality, the intermediate region 31 extends on a central portion of the first dielectric region 30, which defines the aforementioned recess, whereas it leaves an outer portion of the first dielectric region 30 exposed.

The photodetector 1 further comprises a second dielectric region 32, which is made, for example, of TEOS oxide and has a thickness of, for example, between 0.8 µm and 2 µm.

In particular, the second dielectric region 32 extends, in direct contact, on the intermediate region 31, as well as on the outer portion of the first dielectric region 30 left exposed by the intermediate region 31. Moreover, if by "outer part of the peripheral portion of the first intermediate surface $S_{int}$" is meant the part of the peripheral portion of the first intermediate surface $S_{int}$ left exposed by the first dielectric region 30, the second dielectric region 32 extends on said outer part of the peripheral portion of the first intermediate surface $S_{int}$, in contact with the second epitaxial layer 8.

The photodetector 1 further comprises a cavity 57, which extends starting from the bottom surface $S_{inf}$, through the cathode metallization 42, the substrate 2, the first epitaxial layer 6, and part of the second epitaxial layer 8. In particular, the cavity 57 is delimited by a top wall $S_{57}$, formed by the second epitaxial layer 8 and having, for example, a quadrangular shape. Moreover, the cavity 57 is laterally spaced apart, in top plan view, with respect to the first dielectric region 30, since it is arranged on the outside of the latter. In particular, the cavity 57 is overlaid, at a distance, by the aforementioned outer part of the peripheral portion of the first intermediate surface $S_{int}$.

The photodetector 1 further comprises a third dielectric region 33, which extends over the second dielectric region 32, in direct contact therewith, and is delimited at the top by a second intermediate surface S'int. Moreover, the third dielectric region 33 is made, for example, of silicon nitride ($Si_3N_4$) and has a thickness of, for example, between 0.8 µm and 2 µm. The third dielectric region 33 is optional and performs the function of reducing the mechanical surface stresses.

The photodetector 1 further comprises a resistive region 44, which extends over the second dielectric region 33, in direct contact therewith. In particular, the resistive region 44 extends, at a distance, above the cavity 57. In top plan view, the resistive region 44 is hence laterally spaced apart with respect to the first dielectric region 30.

In greater detail, the resistive region 44 is made, for example, of polysilicon of a P+ type, with doping level comprised, for example, between $1 \cdot 10^{19}$ cm$^{-3}$ and $1 \cdot 10^{20}$ cm$^{-3}$. Moreover, the resistive region 44 has an elongated shape, for example, the shape of a squared serpentine (i.e., formed by a succession of alternating first and second portions parallel, for example, to the axis X and to the axis Y, respectively), and has a thickness of, for example, between 0.2 µm and 1 µm. The serpentine may moreover have a constant width of, for example, 0.5 µm and an overall length (understood as the sum of the lengths of the first and second portions, measured along the axis X and the axis Y, respectively) of between 5 mm and 50 mm. More in general, the resistive region 44 is formed by a shaped layer of constant thickness (as has been said before, for example comprised between 0.2 µm and 1 µm), with a front area, understood as area of the projection of the resistive region 44 parallel to the axis Z in the plane XY, that is, for example, greater than 4 mm$^2$.

The photodetector 1 further comprises a fourth dielectric region 34, made, for example, of TEOS oxide, which extends, in direct contact, on the resistive region 44 and on the third dielectric region 33, and in particular on the portions of the latter not covered by the resistive region 44. For example, the fourth dielectric region 34 has a thickness of between 1 µm and 10 µm. Moreover, the fourth dielectric region 34 is delimited at the top by a top surface $S_{sup}$.

In practice, the portion of the second epitaxial layer 8 that forms the top wall $S_{57}$ and the overlying portions of the second, third, and fourth dielectric regions 32, 33, 34 form a membrane, extending within which is the resistive region 44.

The photodetector 1 further comprises a lateral isolation region 24, which is arranged on the outside of the first dielectric region 30 and has a hollow shape.

In particular, in top plan view, the lateral isolation region 24 has, for example, the shape of an annulus or a quadrangular frame. Moreover, the lateral isolation region 24 extends through a bottom portion of the fourth dielectric region 34, as well as through the third dielectric region 33, the second dielectric region 32, the second epitaxial layer 8, and a part of the first epitaxial layer 6.

In greater detail, the cavity 57 and the resistive region 44 are arranged on the outside of the lateral isolation region 24. Moreover, the lateral isolation region 24 delimits a volume V.

Without any loss of generality, assuming an orthogonal reference system XYZ having axes X and Y parallel to the first intermediate surface $S_{int}$, the lateral isolation region 24 has an axis of symmetry H, which may coincide with the axes of symmetry of the anode region 12, the guard ring 16, and the first dielectric region 30.

Once again without any loss of generality, the second lateral isolation region 24 extends in a trench 36, which extends between a maximum height $h_{max}$ and a minimum height $h_{min}$, measured along the axis Z; the difference $h_{max} - h_{min}$ may, for example, be comprised between 8 μm and 20 μm. Without any loss of generality, the maximum height $h_{max}$ and the minimum height $h_{min}$ of the lateral isolation region 24 are invariant with respect to the angular co-ordinate, referred to a cylindrical co-ordinate system (not shown) with axis coinciding with the axis of symmetry H.

In turn, the lateral isolation region 24 comprises a channel-stopper region 27 arranged more externally, made of dielectric material (for example, oxide) and arranged in direct contact with the semiconductor body 3 and the second, third, and fourth dielectric regions 32, 33, 34; the channel-stopper region 27 coats the side walls and the bottom of the trench 36. Moreover, the lateral isolation region 24 comprises a barrier region 28, made (for example) of tungsten, which is surrounded laterally and at the bottom by the channel-stopper region 27, with which it is in direct contact. The barrier region 28 moreover contacts the fourth dielectric region 34 at the top.

This having been said, the anode region 12, the guard ring 16, the intermediate region 31, and the first dielectric region 30 extend within the aforementioned volume V. The resistive region 44, and hence also the cavity 57, extend on the outside of the volume V.

In particular, the top wall $S_{57}$ of the cavity 57 is parallel to the plane XY and extends at a height comprised between the minimum height $h_{min}$ and the height at which the first intermediate surface $S_{int}$ extends. Moreover, the resistive region 44 extends between a respective maximum height $h'_{max}$ and a respective minimum height $h'_{min}$, the latter height being equal to the height at which the second intermediate surface $S'_{int}$ extends. Moreover the relation $h_{min} < h'_{min} < h'_{max} < h_{max}$ applies. In addition, as mentioned previously, the difference $h'_{max} - h'_{min}$ may, for example, be comprised between 0.2 μm and 1 μm.

The photodetector 1 further comprises a conductive region 60 (shown qualitatively in FIG. 1) made, for example, of heavily doped polysilicon or of a metal (for example, aluminum). The conductive region 60 extends through the second, third, and fourth dielectric regions 32, 33, 34, so as to contact a first end of the resistive region 44 and the intermediate region 31, which are hence electrically connected together. In particular, the conductive region 60 can encompass from above the lateral isolation region.

The photodetector 1 further comprises an anode metallization 62, which extends through the fourth dielectric region 34 so as to contact a second end of the resistive region 44.

For practical purposes, the substrate 2, the first and second epitaxial layers 6, 8 and the enriched region 14 form a cathode region. Moreover, by coupling the cathode metallization 42 and the anode metallization 62 to an external generator (not shown), it is possible to reversely bias the photodetector 1 so that the aforementioned first junction between the anode region 12 and the cathode region will be at a reverse-biasing voltage $V_A$ higher, in modulus, than its own breakdown voltage $V_B$.

Moreover, the resistive region 44 is connected in series to the diode formed by the aforementioned first junction between the anode region 12 and the cathode region; the resistive region 44 hence acts as quenching resistor of the photodetector 1. In this connection, between the first and the second ends of the resistive region 44 a value of resistance is present that depends, inter alia, upon the shape of the resistive region 44 and may be comprised, for example, between 100 kΩ and 10 MΩ.

In practice, the resistive region 44 is traversed by the avalanche currents, and in particular by corresponding pulses, which are generated in the SPAD formed by the aforementioned first junction between the anode region 12 and the cathode region. In the absence of the avalanche current, no current flows in the resistive region 44, which is hence all at one and the same voltage, equal to the reverse-biasing voltage $V_A$. Following upon triggering of the avalanche current (generated, for example, following upon absorption of a photon), within the resistive region 44 a voltage drop occurs on account of the flow of the avalanche current within the resistive region 44. In particular, whereas the second end of the resistive region 44 remains at the reverse-biasing voltage $V_A$, the first end of the resistive region 44 is at a voltage approximately equal to the breakdown voltage $V_B$. Following upon quenching of the avalanche current, the resistive region 44 returns to having all one and the same voltage, equal to the reverse-biasing voltage $V_A$.

In general, triggering of a current pulse may occur even independently of the presence of photons; in other words, the current pulses may be formed also by so-called dark pulses.

On account of flow of the current pulses, the resistive region 44 undergoes an increase in temperature, by the Joule effect. This increase in temperature is favored by the presence of the air contained in the underlying cavity 57, which prevents an effective dispersion of heat.

On account of the increase in temperature, the resistive region 44 acts as a source of infrared radiation. In particular, the infrared radiation generated by the resistive region 44 may be used to illuminate a sample to be analyzed, which, following upon reception of the infrared radiation, generates a corresponding response radiation, which can be analyzed by the SPAD formed by the aforementioned first junction between the anode region 12 and the cathode region; said SPAD has an active area defined, in top plan view, by the enriched region 14. In particular, the active area is the area of the surface that is obtained by projecting, parallel to the axis Z, the enriched region 14 on the first intermediate surface $S_{int}$; for example, the active area may be at least 1600 µm², in order to guarantee a power consumption such as to heat the resistive region 44 even in the absence of incident radiation. Moreover, thanks to the presence of the lateral isolation region 24, the infrared radiation emitted by the resistive region 44 is not detected directly by the SPAD.

Figure 3:
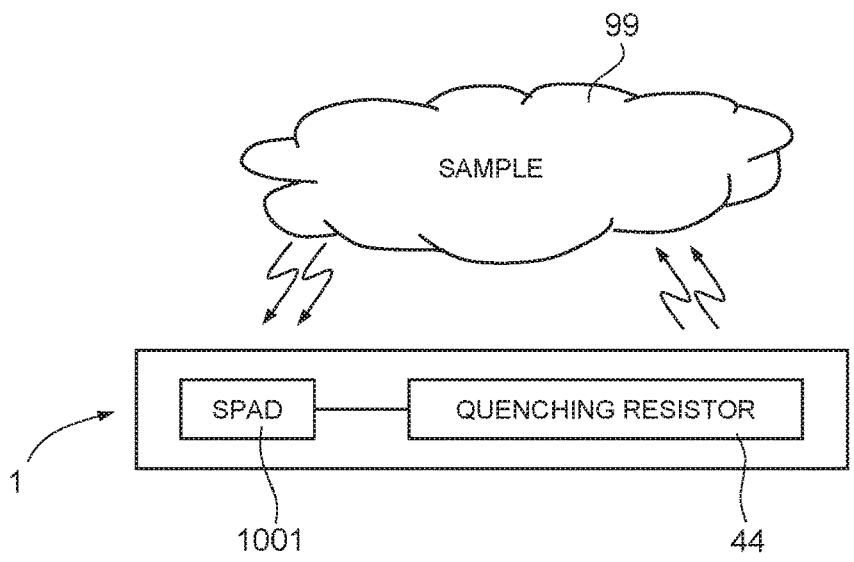
FIG. 3 shows a block diagram of a photodetector, coupled to a sample.

An example of application is shown in FIG. 3. In particular, the photodetector 1 sends the infrared radiation generated by its own resistive region 44 onto a sample to be analyzed (designated by 99), which generates in response a radiation that is detected by the SPAD (designated by 1001) of the photodetector 1.

The resistive region 44 moreover acts as heater. In this connection, as shown by way of example in FIG. 1, the fourth dielectric region 34 may form a recess 64, which gives out onto the top surface $S_{sup}$ and overlies, at a distance, the resistive region 44 and the underlying cavity 57. Extending within the recess 64 is a layer 65, which is made, for example, of a metal oxide or graphene or a metal, and which in what follows will be referred to as the detection layer 65.

Albeit not shown, a chemical species, for example of a gaseous type, can access the recess 64 and can interact chemically with the detection layer 65 so as to vary at least one electrical characteristic of the detection layer 65. Moreover, the detection layer 65 can be connected to a detection circuit (not shown), formed, for example, in a die other than the die 100 and designed to detect the variation of the aforementioned electrical characteristic in order to make it possible to determine an estimate of the concentration of the chemical species. Since the detection layer 65 is heated, by conduction, by the resistive region 44, occurrence of chemical reactions between the detection layer 65 and the chemical species is favored, with consequent increase in sensitivity. Alternatively, and once again by way of example, the chemical species can emit radiation, which is reflected towards the anode region 12 by an external mirror, not shown. In any case, in said examples, the resistive region 44 is inert; i.e., it does not react with the chemical species.

In use, turning-on of a photodetector 1 does not alter, to a first approximation, biasing of the adjacent photodetectors 1. Consequently, the array 220 forms a so-called silicon photomultiplier (SiPM), i.e., an array of SPADs (in the case in point, the photodetectors 1), grown on one and the same substrate and provided with respective quenching resistors decoupled from and independent of one another. These quenching resistors may have values of resistance equal to or different form one another. Moreover, the photodetectors 1 may be connected to one and the same voltage generator (not illustrated) so as to be biased at the aforementioned reverse-biasing voltage VA. The avalanche currents generated within the photodetectors 1 may be multiplexed together so as to generate a signal at output from the SiPM, referred to hereinafter as "array signal". The array signal is equal to the summation of the output signals of the photodetectors 1, which are formed by the avalanche currents. The array signal is hence proportional, to a first approximation, to the number of photons that impinge upon the array 220.

Figure 4:
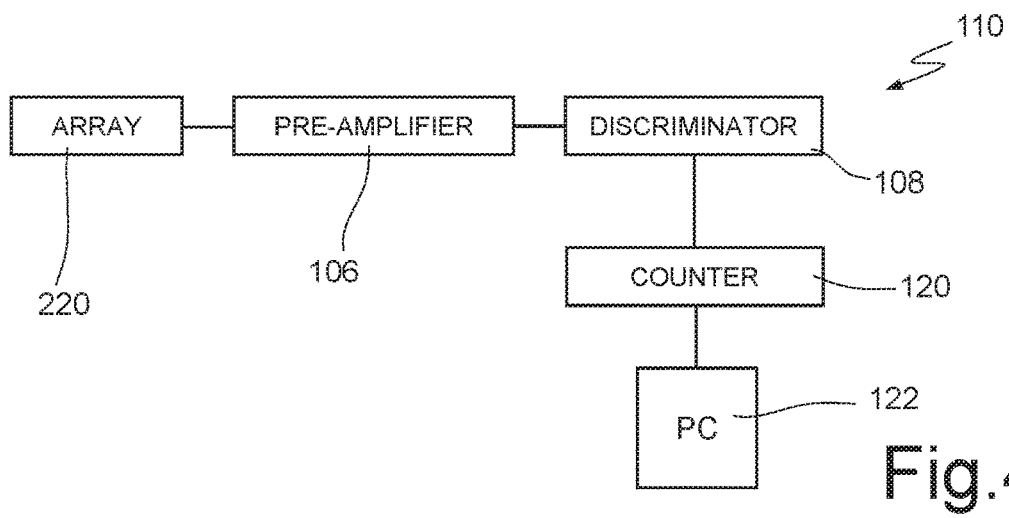
FIG. 4 shows a block diagram of a detection system.

All this having been said, it is possible to make use of the detection system 110 illustrated in FIG. 4, which comprises, in addition to the array 220, appropriately supplied by a corresponding power-supply stage (not illustrated), also a pre-amplifier 106 (optional), a discriminator 108, a counter 120, and a computer 122.

The array 220 is electrically connected to the input of the pre-amplifier 106, the output of which is connected to the input of the discriminator 108. The output of the discriminator 108 is connected to the input of the counter 120, the output of which is connected to the computer 122.

Assuming for simplicity that no radiation impinges on the array 220, the latter generates the aforementioned array signal, which depends upon the dark events. The pre-amplifier 106 amplifies the array signal, generating a pre-amplified signal. The discriminator 108 compares the pre-amplified signal, and in particular the corresponding pulses, with a threshold, filtering the pulses that do not exceed said threshold. In greater detail, the discriminator 108 generates a filtered signal, which comprises just the pulses of the pre-amplified signal that exceed the threshold. The counter 120 determines, on the basis of the filtered signal, the so-called dark-count rate, referred to in what follows as parameter DK, and communicates to the computer 122 a signal indicating said parameter DK. The computer 122 hence determines the power dissipated on the resistive region 44, which is directly proportional to the parameter DK, to the reverse-biasing voltage $V_A$, and to the total capacitance seen from the anode contact. Moreover, the computer 122 determines an estimate of temperature of the resistive region 44, on the basis of the power dissipated and of a physical model, stored in the computer 122. In this way, the detection system 110 enables estimation of the temperature of the resistive region 44, and hence also estimation of the spectral composition of the infrared radiation emitted by the resistive region 44, for example resorting to the black-body approximation.

Figure 5:
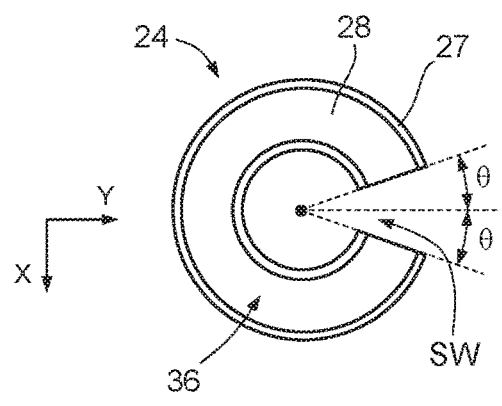
FIG. 5 is a schematic top plan view of a portion of a further embodiment of the present photodetector.

The photodetector 1 may be produced following the manufacturing method that is described hereinafter, with reference, by way of example, to the case in which the recess 64 and the detection layer 65 are absent. Moreover, without any loss of generality, the manufacturing method is described with reference to the embodiment shown in FIG. 5. In said embodiment, the trench 36, and consequently also the lateral isolation region 24, extend over an angular domain of less than 360°. In particular, the trench 36 has in top plan view the shape of a portion of an annulus, which extends over an angular domain comprised between θ and 360°−θ. Consequently, the lateral isolation region 24 laterally defines a window SW, through which the conductive region 60 (not shown in FIG. 5) can extend, in order to connect electrically the resistive region 44 and the intermediate region 31. The conductive region 60 may hence extend in part on the third dielectric region 33, and in part through the latter region and through the second dielectric region 32, but underneath the fourth dielectric region 34.

This having been said, initially formed in a way in itself known are the substrate 2, the first and second epitaxial layers 6, 8, the enriched region 14, the guard ring 16, the first dielectric region 30, and the intermediate region 31, as shown in FIG. 6.

Then, as illustrated in FIG. 7, formed by deposition is a layer 32', referred to hereinafter as the first process layer 32'. The first process layer 32' is to form the second dielectric region 32. The first process layer 32' is made, for example, of TEOS oxide and has a thickness of, for example, 1.2 µm. Moreover, formed by deposition on the first process layer 32' is a layer 33', which will be referred to in what follows as the second process layer 33'. The second process layer 33' is to form the third dielectric region 33.

Figure 8:
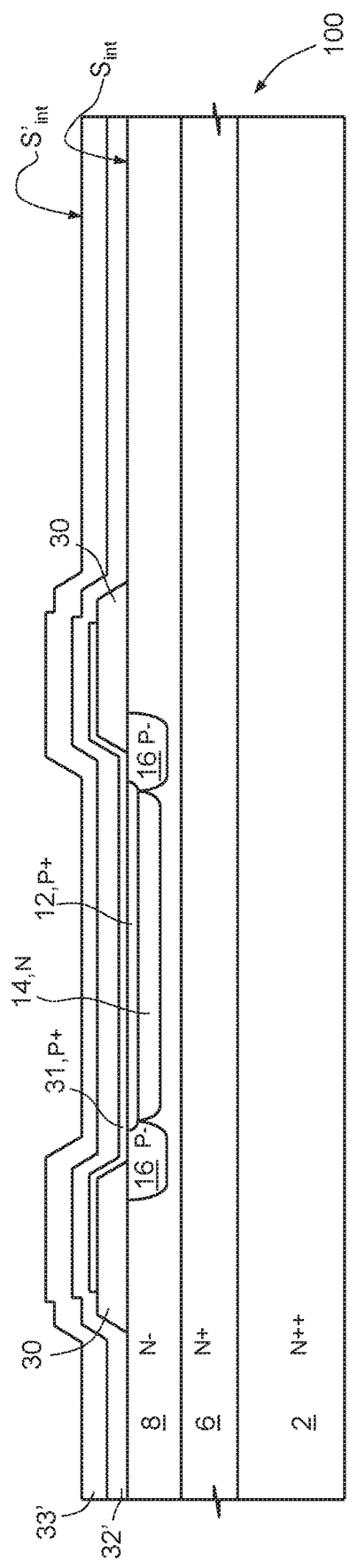

Next, as illustrated in FIG. 8, a thermal annealing is carried out at a temperature of, for example, 1000° C., and with a duration of, for example, two minutes. The aforesaid annealing causes formation of the anode region 12 by diffusion starting from the intermediate region 31.

Figure 9:
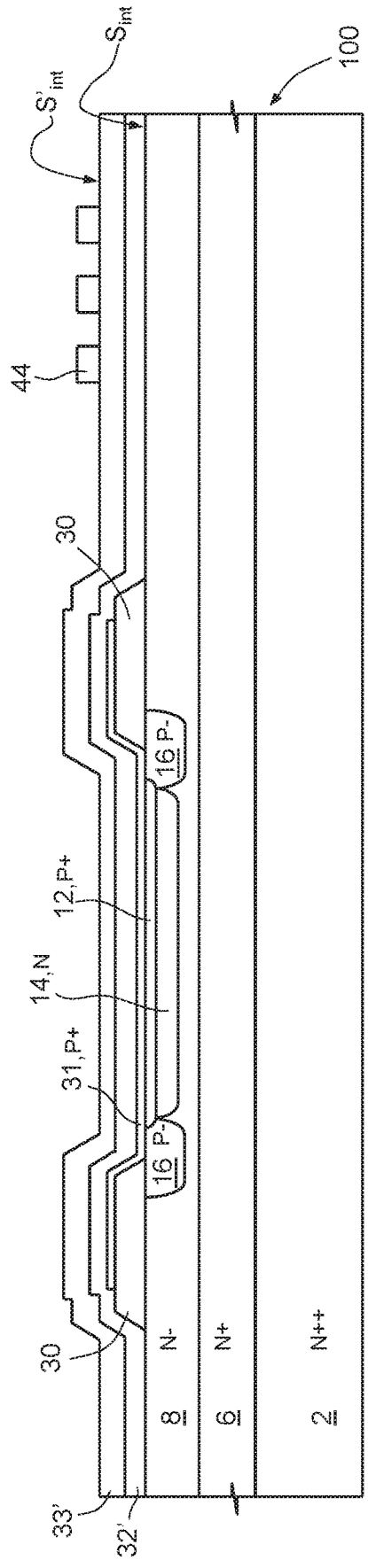

Next, as shown in FIG. 9, the resistive region 44 is formed, on the second process layer 33'. For example, the resistive region 44 is formed by carrying out a deposition in situ of a polysilicon layer having a doping level of $1 \cdot 10^{20}$ cm$^{-3}$ and a thickness of 0.5 µm, as well as by carrying out a subsequent photolithographic process. Albeit not visible in FIG. 9, before or after formation of the resistive region 44, it is possible to carry out a photolithographic process so as to remove selectively portions of the first and second process layers 32', 33' and expose a portion of the intermediate region 31, and subsequently form the conductive region 60, so that it will contact the resistive region 44 and the intermediate region 31.

Figure 10:
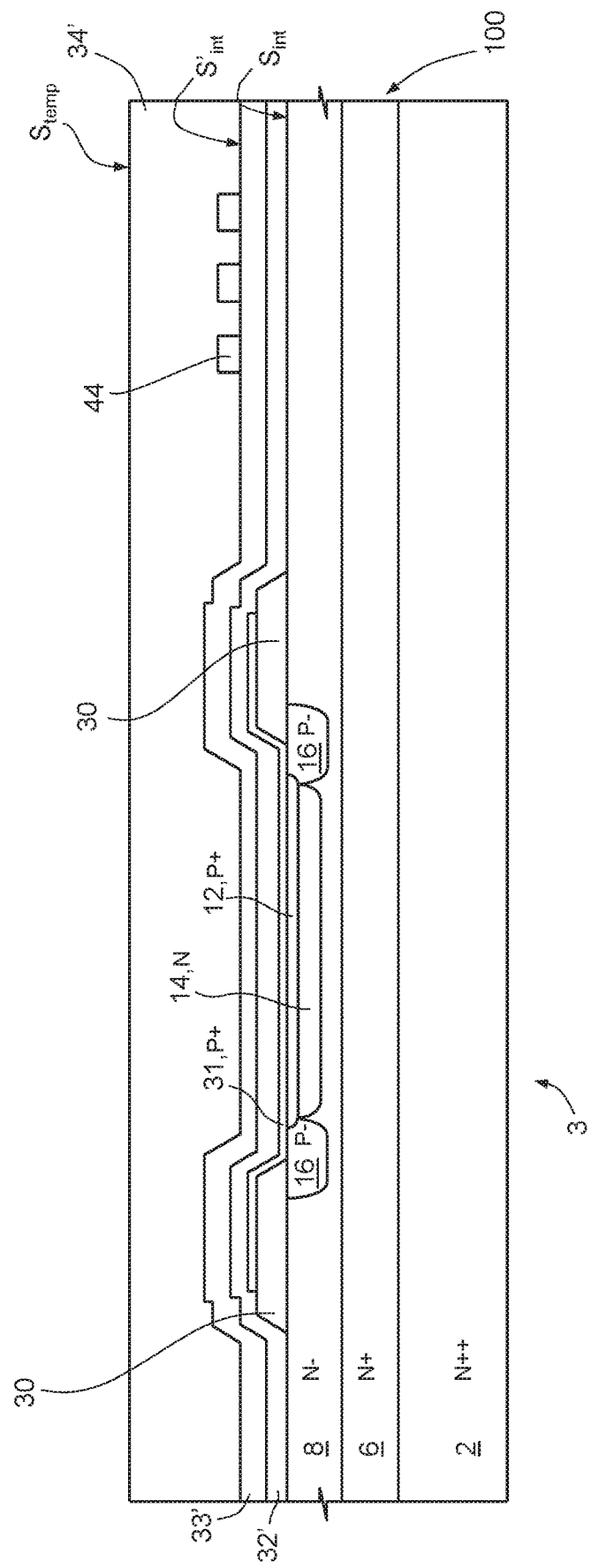

Then, as shown in FIG. 10, formed by means of deposition is a layer 34', which in what follows will be referred to as the third process layer 34'. The third process layer 34' is also planarized and is to form the fourth dielectric region 34. The third process layer 34' is made, for example, of TEOS oxide and has a thickness of, for example, 2 µm. Moreover, the third process layer 34' is delimited at the top by a temporary surface $S_{temp}$.

In greater detail, the third process layer 34' extends on the resistive region 44, on the conductive region 60 (not visible in FIG. 10), and on the exposed portions of the second process layer 33'.

Figure 11:
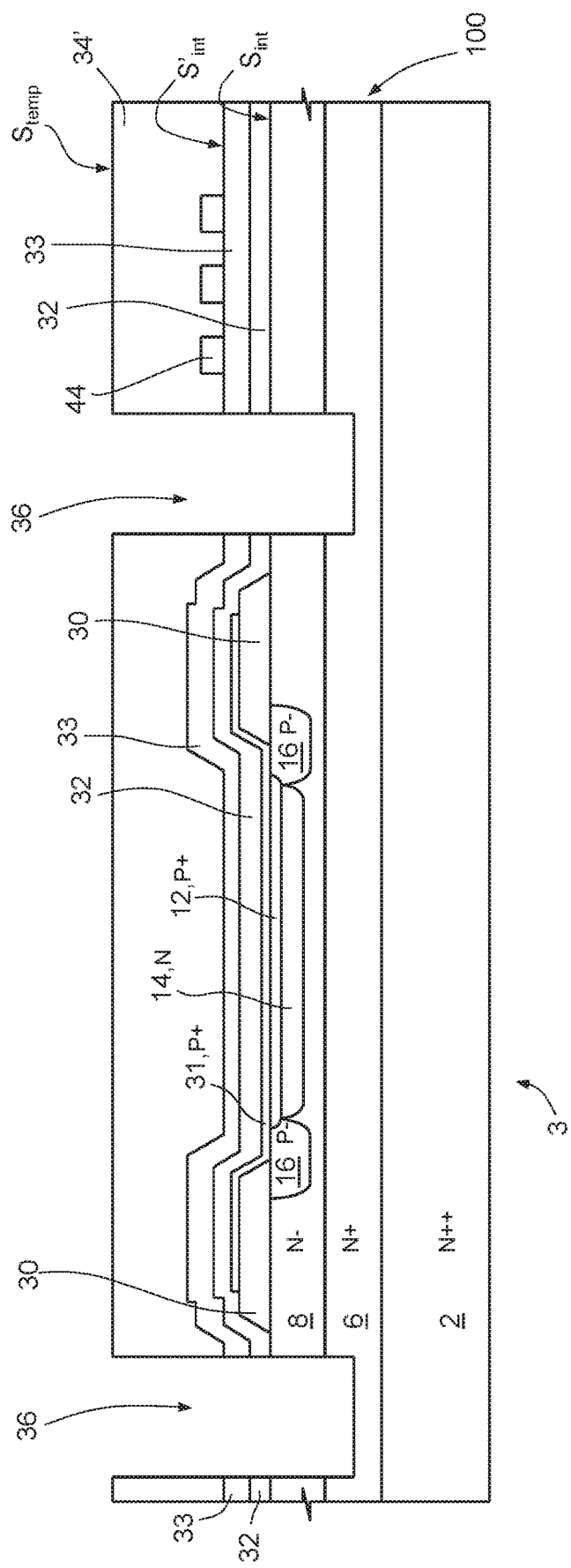

Next, as shown in FIG. 11, a dry etch is carried out in order to create the trench 36 by means of selective removal of portions of the first, second, and third process layers 32', 33', 34', as well as portions of the first and second epitaxial layers 6, 8. The trench 36 extends starting from the temporary surface $S_{temp}$.

Following upon formation of the trench 36, the residual portions of the first and second process layers 32', 33' form the second and third dielectric regions 32, 33, respectively.

Figure 12:
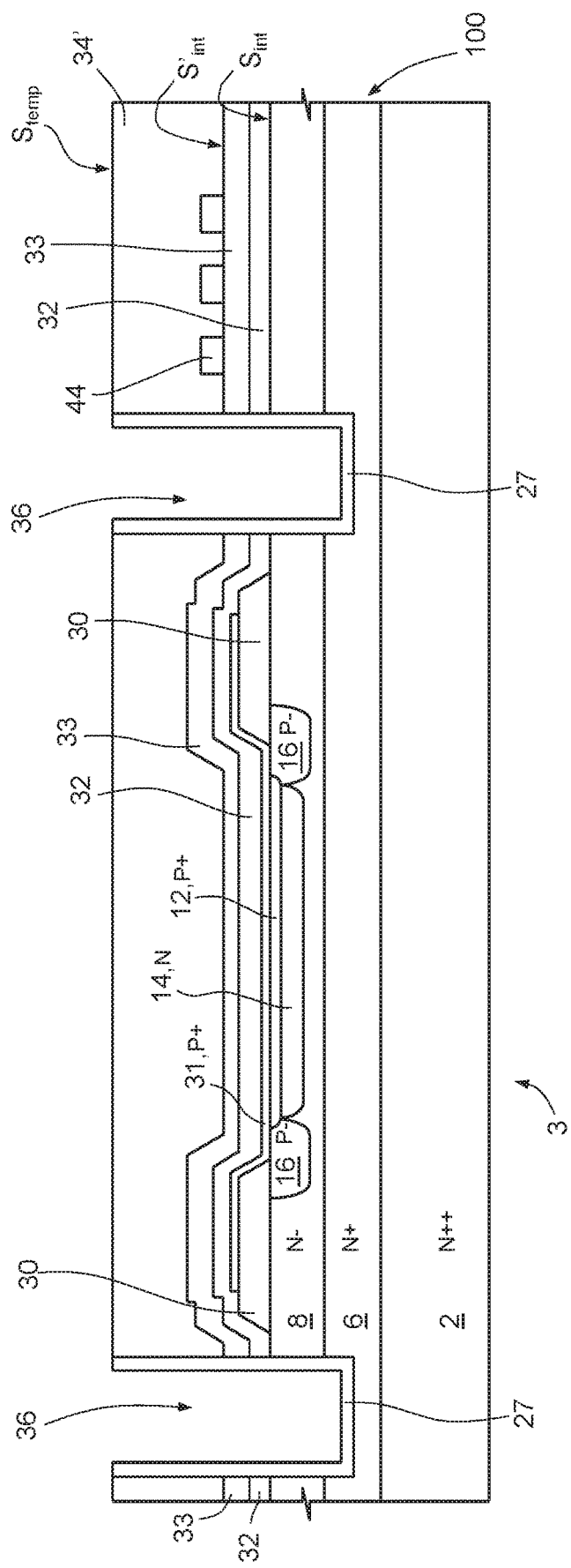

Next, as shown in FIG. 12, the channel-stopper region 27 is formed, for example by means of a process of deposition of TEOS oxide and subsequent selective removal. In this way, the channel-stopper region 27 coats the side walls and the bottom of the trench 36.

Figure 13:
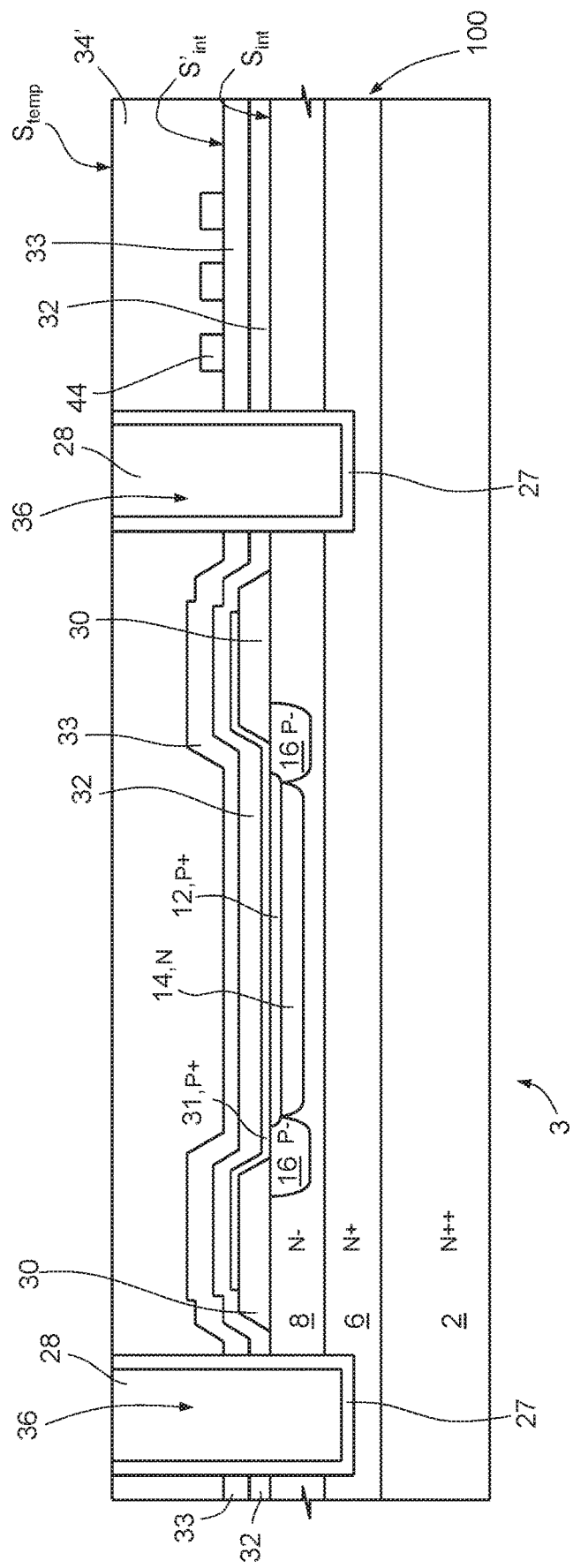

Then, in a way in itself known, the barrier region 28 is formed within the trench 36, as shown in FIG. 13. In this way, the lateral isolation region 24 is formed.

Figure 14:
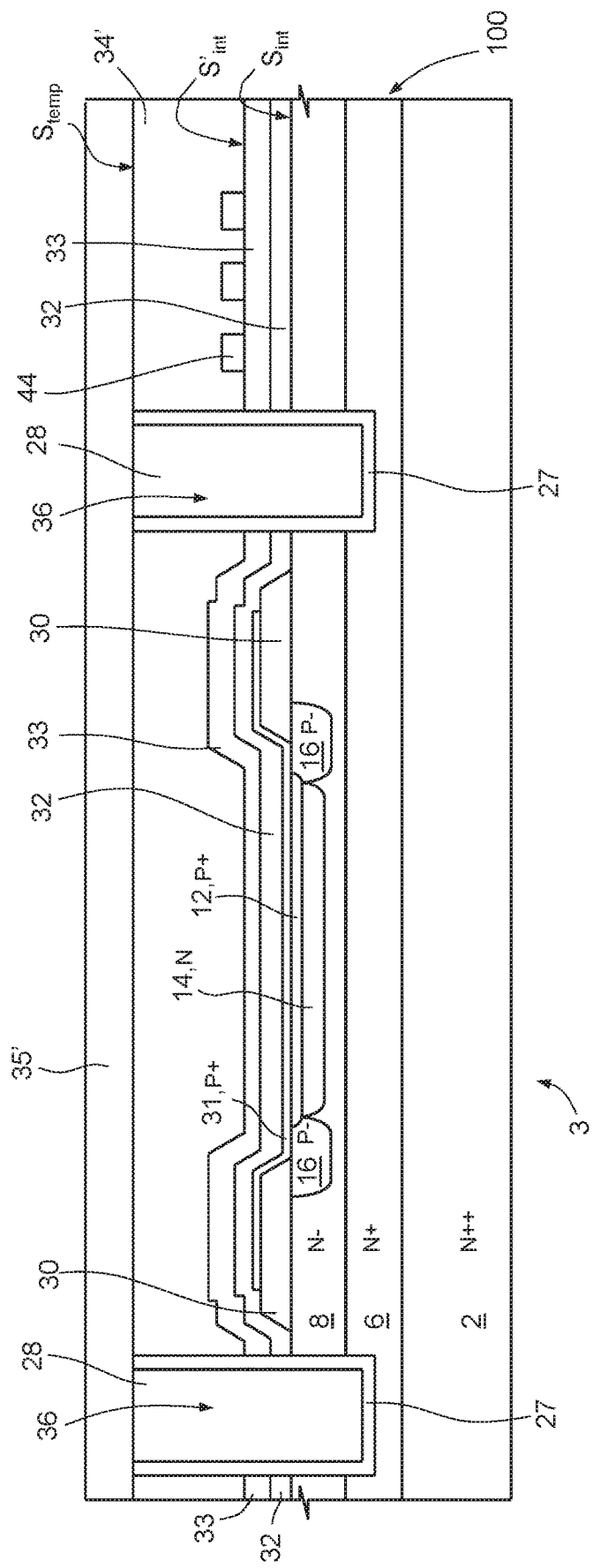
Figure 15:
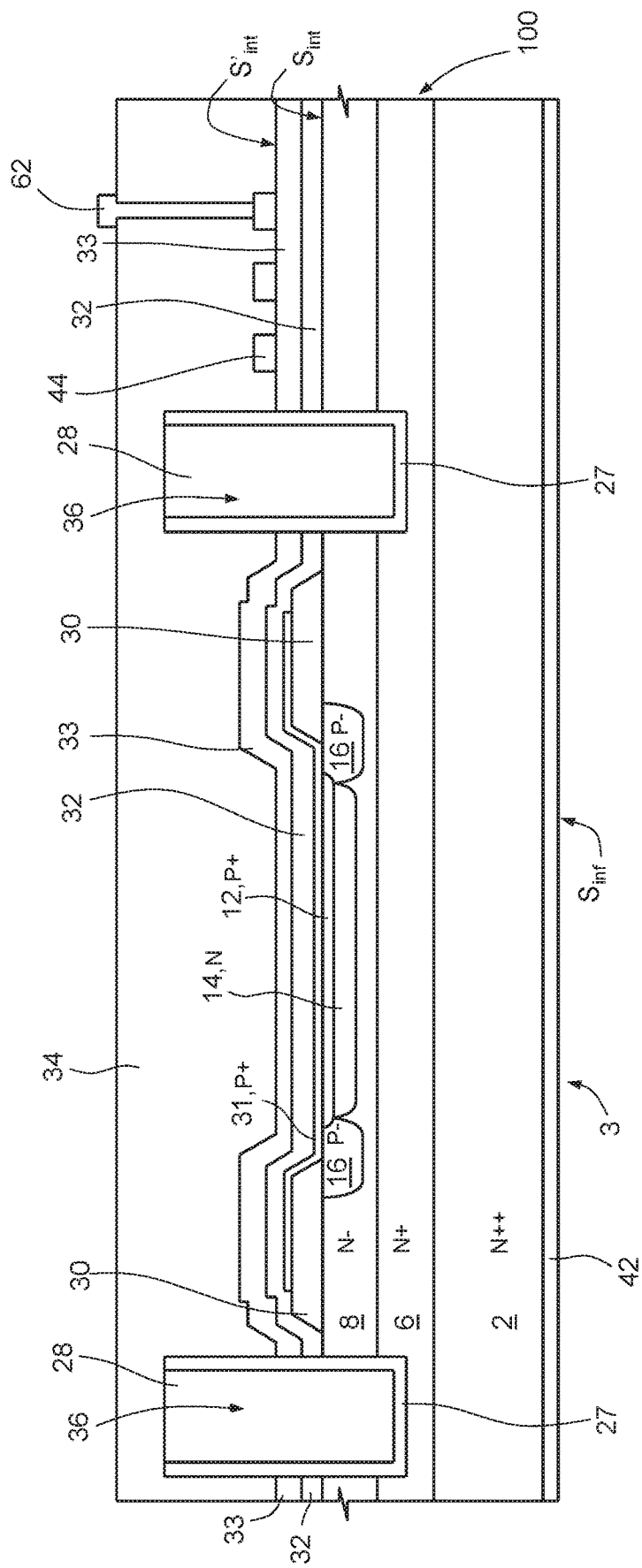

Next, as shown in FIG. 14, formed by deposition is a layer 35', which will be referred to, in what follows, as the fourth process layer 35'. The fourth process layer 35' is arranged on the third process layer 34', as well as on the lateral isolation region 24, and forms, together with the third process layer 34', the fourth dielectric region 34, as shown in FIG. 15. The fourth process layer 35' is made, for example, of TEOS oxide and has a thickness of, for example, 2 µm.

Then, as shown once again in FIG. 15, the cathode metallization 42 and the anode metallization 62 are formed, in a way in itself known.

Figure 16:
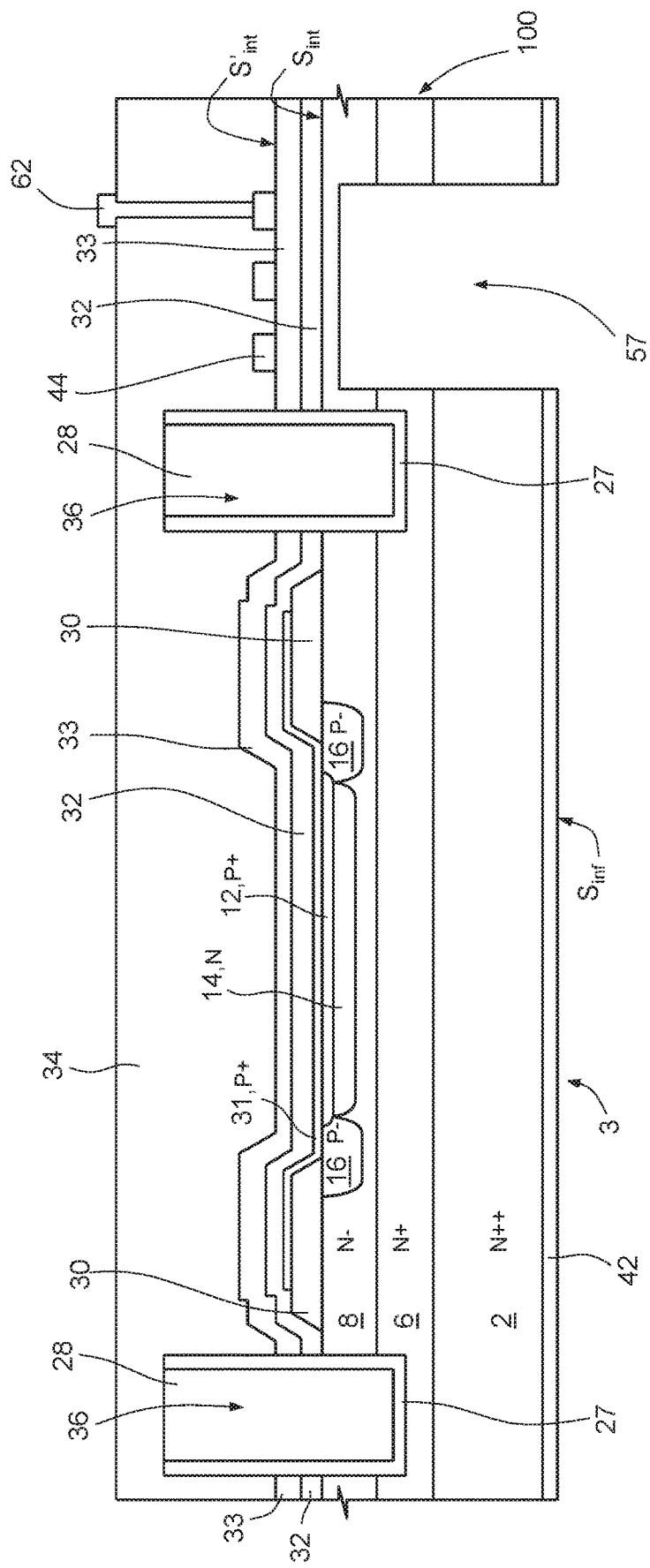

Next, as shown in FIG. 16, an etch (for example, a dry etch) is carried out for selective removal of a part of the cathode metallization 42, starting from the bottom surface $S_{inf}$, and of an overlying portion of semiconductor material, so as to form the cavity 57.

From what has been described and illustrated previously, the advantages that the present solution affords are evident.

In particular, the present photodetector is based on the idea of exploiting the quenching resistor, of an integrated type, for generating infrared radiation, without said radiation interfering with operation of the SPAD, thanks to the presence of the lateral isolation region. In this connection, it may occur that, in the case of an active area of, for example, 1600 µm$^2$ and with a reverse-biasing voltage of −5V, and moreover assuming that the resistive region 44 has a thickness of 0.5 µm and a shape such that the resistance is 300 kΩ, the dark events alone are sufficient for raising the temperature of the resistive region 44 up to approximately 700° C., with consequent spectral emission that exhibits a peak at 4 µm of approximately 0.685 W/(sterad·nm·m$^2$).

On the other hand, the emission of infrared radiation may be viewed as a secondary effect of the process of heating of the resistive region 44, in the case where the photodetector is devised for applications in which the effect of greater interest consists in raising the temperature of a portion of the photodetector as against emitting infrared radiation towards the outside. In this case, the photodetector may comprise a shield that prevents the infrared radiation from propagating outside the photodetector itself.

Once again with reference to the effect of heating of the resistive region 44, the present photodetector represents an evident advantage in terms of possibility of miniaturization as compared to known optoelectronic systems, which include, in addition to a SPAD, a source of heat, which is physically and electrically separated from the SPAD and performs the task of raising the temperature in order to facilitate occurrence of a chemical reaction, so as to enable interaction between the optoelectronic system and a chemical species involved in the chemical reaction.

In addition, the present photodetector is characterized by a high flexibility of use. Moreover, in the case of the array, it is possible to integrate photodetectors that, as mentioned previously, have different quenching resistors so as to vary the spectral characteristics of the radiation emitted. For example, it is possible to integrate photodetectors with quenching resistors that have one and the same thickness, but different shapes in top plan view.

Finally, the presence of a Geiger mode diode guarantees a high sensitivity and short response times during detection.

Finally, it is clear that modifications and variations may be made to what has been described and illustrated herein, without thereby departing from the sphere of protection of the present disclosure.

The semiconductor body 3 may have a composition different from what has been described. Consequently, also the dielectric regions may be different from what has been described, both in terms of composition and in number. For example, the third dielectric region 33 may be absent.

The cavity 57 may have a shape different from what has been described. For instance, the cavity 57 may traverse entirely the semiconductor body 3, in which case the top wall $S_{57}$ may be formed, for example, by the second dielectric region 32, instead of by the second epitaxial layer 8.

The lateral isolation region 24 may overly, at a distance, the semiconductor body 3 instead of extending in part therein. Also in this case, the lateral isolation region 24 laterally delimits a portion of the dielectric region 32; moreover, the anode region 12 extends underneath the portion of second dielectric region 32 delimited by the lateral isolation region 24, which is interposed between the aforementioned portion of the second dielectric region 32 and the resistive region 44.

Also the manufacturing method may differ from what has been described. Purely by way of example, the anode region 12 may be formed by implantation instead of by diffusion.

Finally, all the types of doping may be reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A photodetector comprising:
a body of semiconductor material having a front surface;
a Geiger mode avalanche photodiode formed in the body and including:
   a cathode region having a first type of conductivity and positioned at the front surface; and
   an anode region having a second type of conductivity, which extends in the cathode region starting from the front surface;
a dielectric region arranged on the front surface and above the anode region;
a quenching resistor which extends on the dielectric region, is electrically connected to the anode region, and is laterally spaced apart from the anode region; and
an optical-isolation region which extends through the dielectric region and laterally delimits a portion of the dielectric region, the anode region extending underneath said portion of the dielectric region, the optical-isolation region being moreover interposed between said portion of the dielectric region and the quenching resistor.

2. The photodetector according to claim 1, wherein the optical-isolation region moreover extends through part of the semiconductor body and laterally envelops at least part of the anode region, the optical-isolation region being moreover interposed between the anode region and the quenching resistor.

3. The photodetector according to claim 1, further comprising a cavity, which extends through at least part of the semiconductor body, at least in part underneath the quenching resistor.

4. The photodetector according to claim 1, wherein the quenching resistor is made of polysilicon.

5. The photodetector according to claim 1, wherein the quenching resistor has an elongated shape.

6. The photodetector according to claim 1, wherein the optical-isolation region extends in a trench and comprises a conductive region and an insulating region, which surrounds at least part of the conductive region and coats a bottom and side walls of the trench.

7. The photodetector according to claim 1, further comprising a front region of dielectric material, which extends on the dielectric region and on the quenching resistor; and wherein said optical-isolation region extends in part through said front region.

8. The photodetector according to claim 1, further comprising an intermediate semiconductor region having the second type of conductivity, which is interposed between the anode region and the dielectric region; and wherein the quenching resistor is electrically coupled to the anode region through the intermediate semiconductor region.

9. The photodetector according to claim 1, wherein said first type of conductivity is a conductivity of an N type, and wherein said second type of conductivity is a conductivity of a P type.

10. The photodetector according to claim 1, further comprising a cathode metallization, arranged underneath the semiconductor body, and an anode metallization, which contacts the quenching resistor; and wherein the anode region and the cathode region form a diode; and wherein said diode and the quenching resistor are connected in series between the anode and cathode metallizations.

11. A method for analyzing a sample, comprising:
getting infrared radiation generated by the quenching resistor of the photodetector according to claim 1 to impinge upon the sample; and
detecting radiation coming from the sample using the Geiger mode avalanche photodiode of said photodetector according to claim 1.

12. An array of devices, comprising:
a die of semiconductor material having a front surface; and
a plurality of photodetectors, each photodetector including:
   a Geiger mode avalanche photodiode formed in the die and including:
      a cathode region having a first type of conductivity and positioned at the front surface; and
      an anode region having a second type of conductivity, which extends in the cathode region starting from the front surface;
   a dielectric region arranged on the front surface and above the anode region;
   a quenching resistor which extends on the dielectric region, is electrically connected to the anode region, and is laterally spaced apart from the anode region; and
   an optical-isolation region which extends through the dielectric region and laterally delimits a portion of the dielectric region, the anode region extending underneath said portion of the dielectric region, the optical-isolation region being moreover interposed between said portion of the dielectric region and the quenching resistor.

13. A method for manufacturing a photodetector, comprising:
forming a Geiger mode avalanche photodiode in a body of semiconductor material, which is delimited by a front surface, said forming the Geiger mode avalanche photodiode including:
   forming a cathode region, having a first type of conductivity, at the front surface; and
   forming an anode region having a second type of conductivity, which extends in the cathode region starting from the front surface;
forming a dielectric region on the front surface; and
forming, on the dielectric region, a quenching resistor which is electrically connected to the anode region and is laterally spaced apart from the anode region; and
forming, through the dielectric region, an optical-isolation region which laterally delimits a portion of the dielectric region, the anode region extending underneath said portion of the dielectric region, the optical-isolation region being moreover interposed between said portion of the dielectric region and the quenching resistor.

14. The manufacturing method according to claim 13, wherein forming the optical-isolation region comprises forming the optical-isolation region to extend through part of the semiconductor body and laterally surround at least part of the anode region, the optical-isolation region being moreover interposed between the anode region and the quenching resistor.

15. The manufacturing method according to claim 13, further comprising forming, underneath at least part of the quenching resistor, a cavity which extends through at least part of the semiconductor body.

16. The manufacturing method according to claim 13, further comprising forming a front region of dielectric material on the dielectric region and on the quenching resistor; and wherein forming the optical-isolation region is such that the optical-isolation region extends in part through said front region.

17. The manufacturing method according to claim 16, wherein forming the dielectric region comprises forming a bottom dielectric layer on the front surface and subsequently forming the quenching resistor; and wherein forming the front region comprises:

after forming the quenching resistor, forming an initial dielectric layer, on said bottom dielectric layer and on the quenching resistor;

selectively removing portions of the initial dielectric layer and of said bottom dielectric layer so as to form a trench; and forming a final dielectric layer on the initial dielectric layer and on the optical-isolation region after forming the optical-isolation region within the trench.

18. The manufacturing method according to claim 13, wherein the anode region and the cathode region form a diode, said method further comprising:

forming a cathode metallization underneath the semiconductor body;

forming an anode metallization, which contacts the quenching resistor; and connecting in series said diode and the quenching resistor between the anode and cathode metallizations.

19. The manufacturing method according to claim 13, further comprising forming, between the anode region and the dielectric region, an intermediate semiconductor region having the second type of conductivity, which is electrically interposed between the quenching resistor and the anode region.

20. The manufacturing method according to claim 19, wherein forming the anode region comprises:

after forming the cathode region, forming the intermediate semiconductor region; and then carrying out a thermal annealing.

\* \* \* \* \*